United States Patent
Tuinhout et al.

(10) Patent No.: US 7,737,817 B2
(45) Date of Patent: Jun. 15, 2010

(54) RESISTOR NETWORK SUCH AS A RESISTOR LADDER NETWORK AND A METHOD FOR MANUFACTURING SUCH A RESISTOR NETWORK

(75) Inventors: Hans Paul Tuinhout, Eindhoven (NL); Gian Hoogzaad, Delft (NL); Maarten Vertregt, Eindhoven (NL)

(73) Assignee: NXP B.V., Eindhoven (NL)

( * ) Notice: Subject to any disclaimer, the term of this patent is extended or adjusted under 35 U.S.C. 154(b) by 829 days.

(21) Appl. No.: 10/517,106

(22) PCT Filed: May 21, 2003

(86) PCT No.: PCT/IB03/02192

§ 371 (c)(1),
(2), (4) Date: Dec. 7, 2004

(87) PCT Pub. No.: WO03/105229

PCT Pub. Date: Dec. 18, 2003

(65) Prior Publication Data

US 2005/0224915 A1 Oct. 13, 2005

(30) Foreign Application Priority Data

Jun. 11, 2002 (EP) .................................. 02077286

(51) Int. Cl.
*H01C 7/22* (2006.01)

(52) U.S. Cl. ........................... 338/295; 338/72; 338/320

(58) Field of Classification Search .................. 338/295
See application file for complete search history.

(56) References Cited

U.S. PATENT DOCUMENTS

| 4,228,418 A | * | 10/1980 | Piedmont et al. | 338/195 |
| 4,505,032 A | * | 3/1985 | Praria | 29/621 |
| 4,636,831 A | | 1/1987 | Ono | |
| 5,268,651 A | * | 12/1993 | Kerth | 330/307 |
| 5,872,504 A | * | 2/1999 | Greitschus et al. | 338/320 |
| 6,507,272 B1 | * | 1/2003 | Nicholson et al. | 338/320 |

FOREIGN PATENT DOCUMENTS

| DE | 197 32 842 A1 | 2/1999 |
| EP | 0 932 256 A1 | 7/1999 |
| JP | 54 087489 A | 7/1979 |
| JP | 03 098317 A | 4/1991 |

\* cited by examiner

*Primary Examiner*—Elvin G Enad
*Assistant Examiner*—Joselito Baisa

(57) ABSTRACT

The invention relates to a resistor network (2) such as a resistor ladder network, comprising at least a resistor body (4) which is provided with at least a column (6) of taps (8) situated between a first tap and a second tap, wherein, in use, at least two taps can be connected with respective first and second sources of reference input potentials, and wherein each tap of the at least one column of taps can be used for outputting an output potential via a contact area which is connected with the concerning tap, wherein the resistor body (4) comprises a multiple of resistor sub-bodies (5), wherein each resistor sub-body (5) is connected with a column (6) of taps (8), and wherein the only electrical connections between the resistor sub-bodies (5) are established by electrical connections via taps (8) connected with the resistor sub-bodies (5). Furthermore the invention relates to a method for manufacturing a resistor network (2) such as a resistor ladder network.

13 Claims, 6 Drawing Sheets ies is known in actual practice. # RESISTOR NETWORK SUCH AS A RESISTOR LADDER NETWORK AND A METHOD FOR MANUFACTURING SUCH A RESISTOR NETWORK The invention relates to a resistor network such as a resistor ladder network, comprising at least a resistor body which is provided with at least a column of taps situated between a first tap and a second tap, wherein, in use, at least two taps can be connected with respective first and second sources of reference input potentials, and wherein each tap of the at least one column of taps can be used for outputting an output potential via a contact area connected with the concerning tap. Furthermore the invention relates to method for manufacturing a resistor network such as a resistor ladder network, comprising the following step:

manufacturing a resistor network comprising a resistor body with at least a column of taps, wherein the taps are situated between a first tap and a second tap.

Said resistor networks and said methods for manufacturing such resistor networks are known in actual practice. The taps of the resistor networks can be connected with (metal) contact areas which can be connected with metal connecting wires. Mostly, metal plates are used for forming the contact areas. The sources of reference input potentials or reference voltages can be connected via respective metal connecting wires with the respective contact areas connected with the respective first and second taps. Subsequently, output potentials or output voltages can be outputted via metal wires which are connected with contact areas connected with taps between the first tap and the second tap. In this way, a series of precisely derived (partial) potentials of said reference input potentials can be generated by the resistor network.

The said resistor network can for example be used in an A/D or in a D/A converter. In order to obtain converters with a high linearity it is of importance to use resistor networks with a high linearity. For this, the electrical resistances of the parts of the resistor body between successive taps have to be essentially equal. Differences in electrical resistances of different parts of the resistor body are called a mismatch of the resistor network or a mismatch of resistor network elements. It is a main object of the invention to minimize this mismatch.

There are several causes which result in the mismatch discussed hereinbefore. A first possible cause is the existence of local irregularities in the resistor body. Examples of such irregularities are edge roughnesses or, in the case of semiconductor networks, local disruptions in dopant concentration. These irregularities occur during manufacturing in particular at the area or perimeter of the resistor body. The irregularities mainly have a random statistical character.

A first approach to counter the said mismatch is to create relatively large physical dimensions of the resistor body. As a consequence of this, the relative effect of the irregularities is reduced, and thus the mismatch is reduced.

A disadvantage of the first approach mentioned above is that the physical dimensions of the resistor body have to be increased. Increasing the physical dimensions of the resistor body is contrary to the development of miniaturization of ladder networks like the development of semiconductor resistor ladder networks. Large ladder networks will require relatively much silicon material and relatively much space in apparatus wherein they are applied. Furthermore, these kind of resistor ladders will suffer from parasitic capacitances. Consequently, these high precision ladder networks are relatively impractical, expensive and slow operating.

It is an object of the invention to provide a relatively inexpensive high precision resistor network with relatively small physical dimensions. Therefore, the resistor network according to the invention is characterised in that the resistor body comprises a multiple of resistor sub-bodies, wherein each resistor sub-body is connected with a column of taps, and wherein the only electrical connections between the resistor sub-bodies are electrical connections via taps connected with the resistor sub-bodies. In this way, the area and the perimeter of the resistor body is significantly enlarged while maintaining essentially the same physical dimensions. The area or perimeter comprises relatively much irregularities which are statistically averaged. Thus, the net effect of the irregularities, which inevitably occur during manufacturing, is significantly reduced.

A second cause of mismatch is that the current in the resistor sub-bodies can be disturbed at and/or in the vicinity of the taps. It is an object of an embodiment of this invention to reduce the mismatch as a consequence of the second cause. For this, the embodiment of the resistor ladder according to the invention is characterised in that each resistor sub-body is provided with at least one column of taps, wherein each tap of the column of taps is an extremity such as a T-shaped or S-shaped projection of the concerning resistor sub-body. With this construction the current through the resistor sub-body is hardly if at all influenced by outputting output potentials via respectively the taps, the contact areas connected with the taps, and the metal contact wires connected with the contact areas.

A third cause of mismatch is formed by the inevitable different resistance values of parts of the resistor body between successive column positions in a column of taps. The column position of a tap in a column of taps is defined by a (integer) value indicating the relative position of the tap with respect to the position of the first tap and the second tap of the column of taps. The said differences in electrical resistance values of parts of the resistor body appear as a consequence of placement errors of the taps. It is an object of this invention to provide an embodiment of the invention wherein the effects of the third cause are reduced. This object is achieved with an advanced embodiment of the ladder network according to the invention, which is characterised in that a plurality of taps of a first column of taps of a first resistor sub-body is connected with a plurality of taps of a second column of taps of a second resistor sub-body, wherein each tap of the plurality of taps of the first column is connected with only one tap of the plurality of taps of the second column and wherein each tap of the plurality of taps of the second column is connected with only one tap of the plurality of taps of the first column, and wherein each tap of the first column is shifted at least one column position with respect to the column position of the tap of the second column with which the tap of the first column is connected. During manufacturing, taps are placed in connection with the resistor sub-bodies according to corresponding column positions. This can for example be done with masktechniques if the resistor ladder network is a semiconductorcircuit. In such cases, placement errors of the taps at different resistor sub-bodies, but comparable column positions, are correlated. Now, by connecting taps of different resistor sub-bodies, wherein the taps are shifted mutually at least one column-position the effects of the placement errors are largely reduced. In this way a resistor network is achieved with a high linearity. These resistor networks can be used in particular for A/D and D/A converters with a high linearity and/or a high precision.

An embodiment of the resistor network according to the invention is characterised in that the respective connections between the resistor sub-bodies via the taps are made during fabrication of the resistor network at different arbitrary positions with respect to the respective taps. Since the connections with the taps are at arbitrary positions according to this embodiment the said mismatch is further minimised, resulting in a resistor network with a relatively high accuracy.

The method according to the invention is characterised in that the method also comprises the following steps:

generating a number of resistor sub-bodies for shaping the resistor body, wherein the resistor sub-bodies are mutually electrically insulated, and wherein each resistor sub-body is connected with at least a column with taps;

electrically connecting a plurality of taps of a first column of taps of a first resistor sub-body with a plurality of taps of a second column of taps of a second resistor sub-body, wherein each tap of the plurality of taps of the first column is connected with only one tap of the plurality of taps of the second column and wherein each tap of the plurality of taps of the second column is connected with only one tap of the plurality of taps of the first column.

With this method a resistor network according to the invention can be manufactured.

In the accompanying drawings in which certain modes for carrying out the present invention are shown for illustrative purposes:

Figure 1:
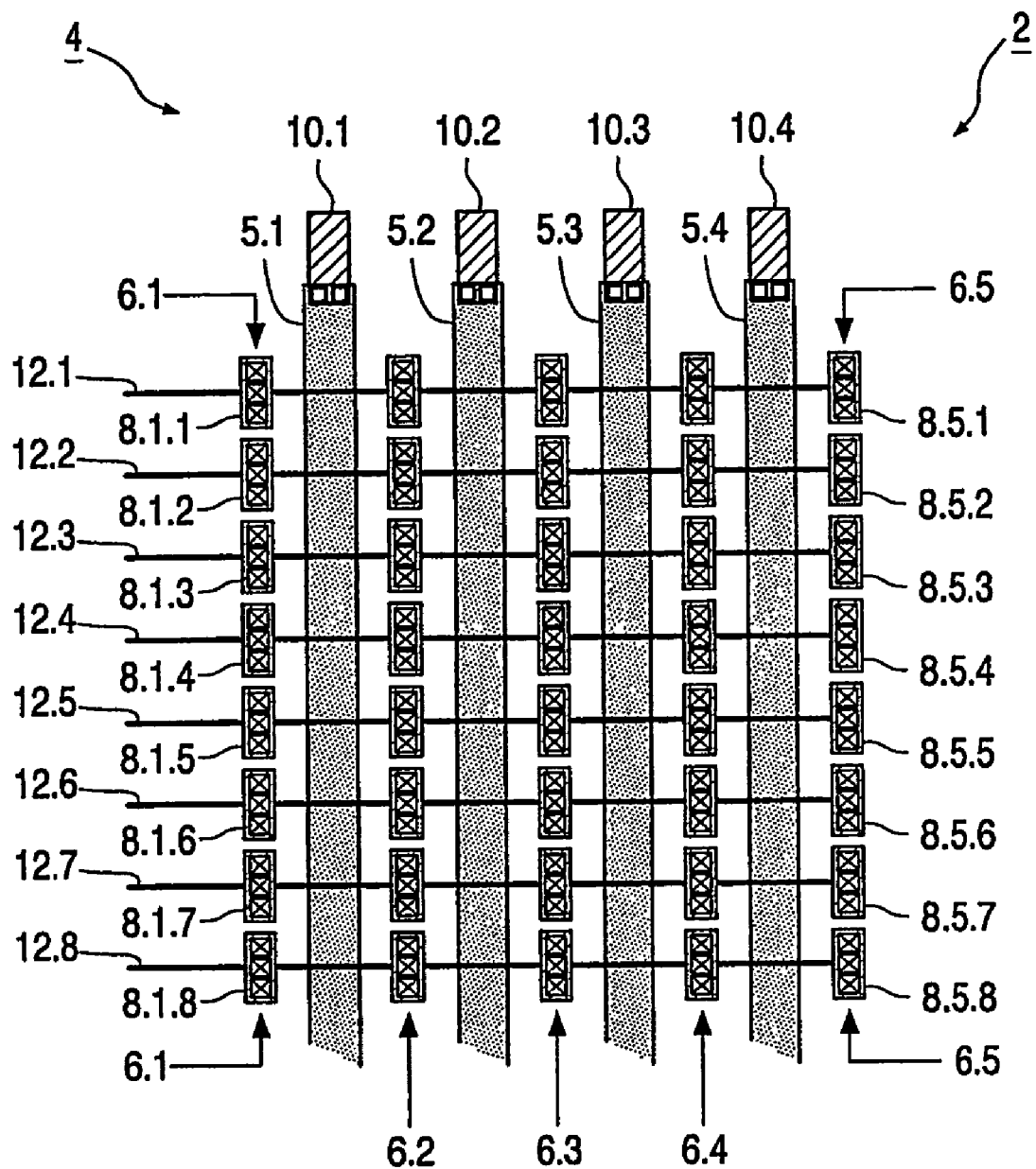
FIG. 1 is a schematic overview of a part of a first embodiment of a resistor network according to the invention.

FIG. 1 shows a resistor network 2 which forms a resistor ladder network. The resistor ladder network 2 comprises a resistor body 4, which comprises resistor sub-bodies 5.$k$ ($k=1, \ldots, 4$). The resistor ladder network 2 also comprises columns 6.$i$, ($i=1, \ldots, 5$) of taps. Each of the columns 6.$i$, ($i=1, \ldots, 5$) of taps is connected with said resistor body 4 and comprises taps 8.$i.j$ ($i=1, \ldots, 5; j=1, \ldots, J$). The index i denotes the number of the column 6.$i$ of taps and the index j denotes the column position of the concerning tap 8.$i.j$ in the $i^{th}$ column 6.$i$. So, in this example the taps are, in a way, situated in a matrix structure. The taps of the column 6.$i$ of taps are situated between a first tap 8.$i.1$ and a second tap 8.$i.J$ ($i=1, \ldots 5$). Furthermore, in this example, the resistor body 4 comprises first supply taps 10.$k$ ($k=1, \ldots, 4$) for connecting the resistor body 4 with a first reference input potential and second supply taps (not shown in FIG. 1) for connecting the resistor body 4 with a second reference input potential. Herewith, the supply taps 10.$k$ ($k=1, \ldots, 4$) normally will be connected to the same reference potential source. It is noted that the reference input potentials can also be fed to the first tap and the last tap. Each tap, and in particular each of the taps 8.$i.j$ ($i=1, \ldots, 5; j=1, \ldots, J$), can be used for outputting an output potential.

The taps 8.$i.j$ ($i=1, \ldots, 5$; fixed j) are connected with a metal contact wire 12.$j$, such that the taps 8.$i.j$ ($i=1, \ldots, 5$; fixed j) are on the same potential. Via the metal contact wire 12.$j$ a $j^{th}$ output potential or voltage from the resistor ladder 2 can be outputted ($j=1, \ldots, J$). The connection of the metal wire 12.$j$ with each of the taps 8.$i.j$ ($i=1, \ldots, 5$; fixed j) is made via a metal contact plate 14.$i.j$ which is fixed with 3 electrical fixation points 16 with the tap 8.$i.j$ (see for example FIG. 2). The metal plate 14.$i.j$ serves as a contact area of the tab 8.$i.j$.

Figure 2:
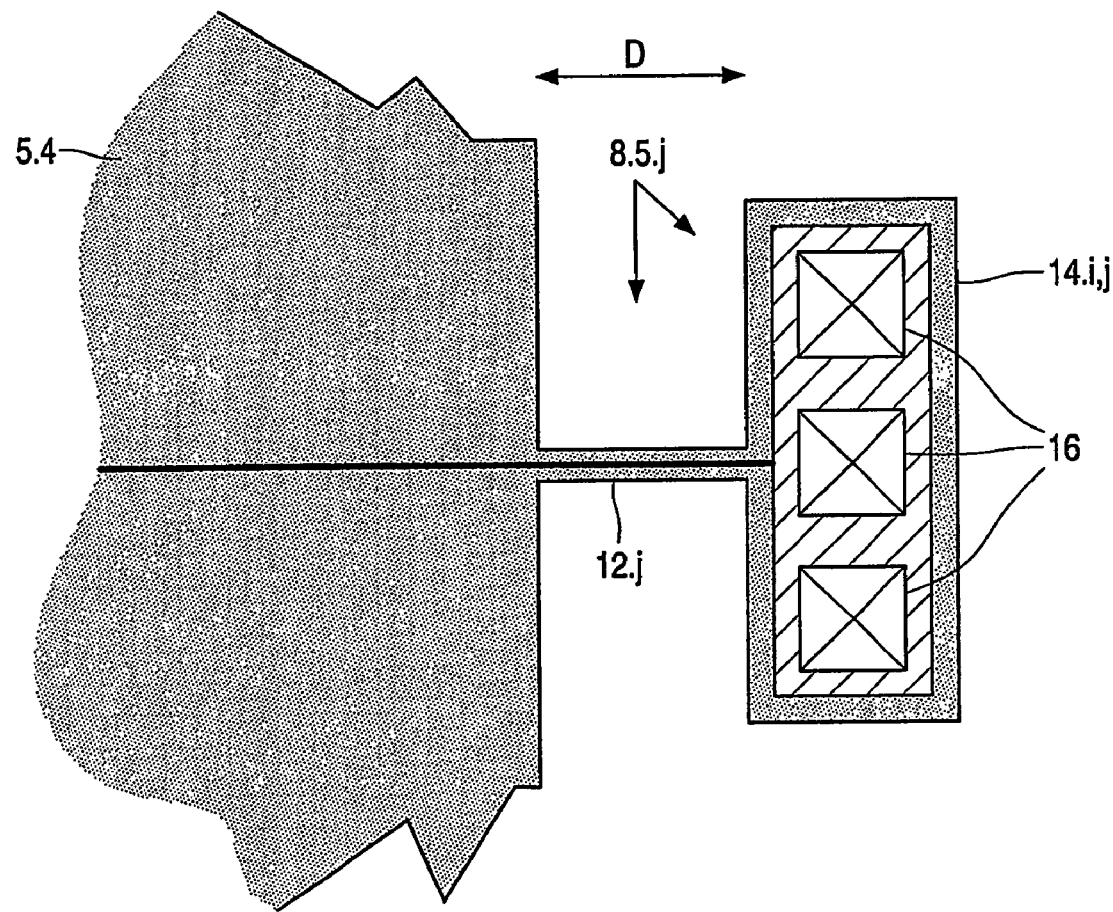
FIG. 2 is a schematic depiction of a part of the first embodiment in FIG. 1.

In FIG. 2 it is further clearly illustrated that the tap 8.$5.j$ is constructed at a distance D aside of the resistor sub-body 5.$4$, wherein the tap 8.$5.j$ is formed according to a T-shaped projection. In this way, the inevitable disturbing currents flowing in the resistor sub-body 5.$4$ in the vicinity of the tap 8.$5.j$ will hardly if at all influence the general current flow through the major part of the resistor body 4 and its resistor sub-body 5.$4$. Thus the corresponding course of the potential along the resistor sub-bodies of the resistor body 4 will not unnecessarily be disturbed.

In the example of FIG. 1 the resistor body 4 comprises a multiple of resistor sub-bodies 5.$k$ ($k=1, \ldots, 4$), wherein each resistor sub-body is connected with two columns of taps which in this example are situated along two sides of the resistor sub-body. It is noticed that neighbouring resistor sub-bodies share columns of taps.

In order to realize a resistor network 2 with highly linear characteristics it is of importance that potentials over parts of the resistor body 4 are proportional with the lengths of the parts of the resistor body 4, i.e. the number of successively passed taps in a column of taps. So, in this particular example of FIG. 1, it is desirable that the electrical resistance of the resistor body 4 between the metal wires 12.$j$ and 12.$(j+1)$ are independent of the value for j ($j=1, \ldots, (J-1)$). However, during manufacturing irregularities occur mainly at the area or the perimeter (surfaces) of the resistor body, which causes differences/disturbances in electrical resistance along the resistor body. To minimize these differences it is desirable to realize a resistor body 4 with a large area, such that the negative disturbance effects of the irregularities are statistically averaged out. The construction of the resistor body 4 is such that the only electrical inter-connections between the resistor sub-bodies 5.$k$ ($k=1, \ldots, 5$) of the resistor network 2 are electrical connections between taps 8.$i.j$ of these resistor sub-bodies via metal plates 14.$i.j$ and via the metal wires 12.$j$ ($i=1, \ldots, 5, j=1, \ldots, J$). The resistor body 4 in this example of FIG. 1 is divided into four resistor sub-bodies 5.$k$ ($k=1, \ldots, 4$). In this way the surface of the resistor body 4 is significantly increased.

Figure 3:
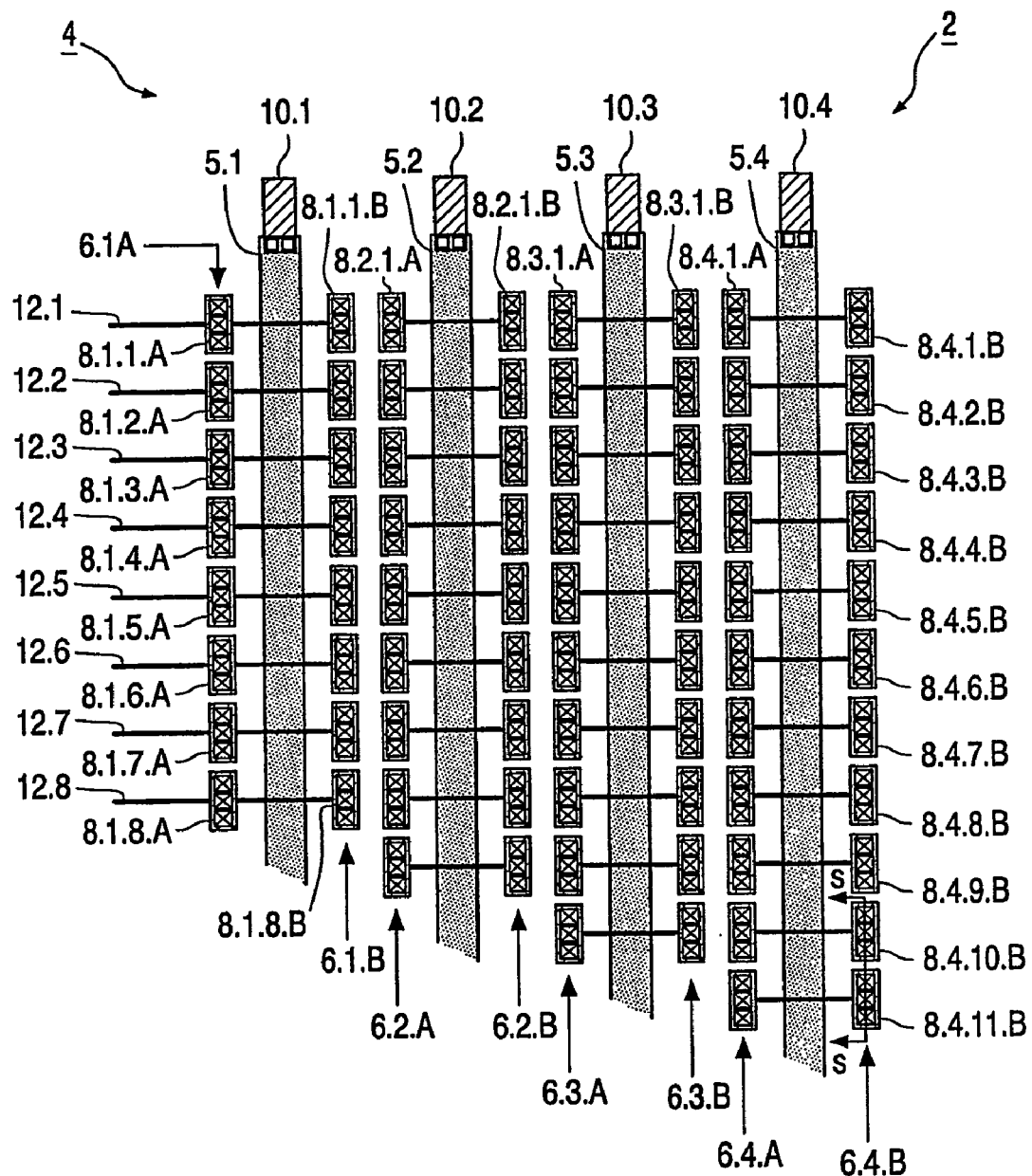
FIG. 3 is a schematic overview of an intermediate stage of a second embodiment of a resistor network according to the invention.

FIG. 3 schematically shows a second embodiment of a resistor network 2 according to the invention in an intermediate stage. This second embodiment is a semiconductor resistor network. FIG. 3 shows four resistor sub-bodies 5.$i$ ($i=1, \ldots, 4$), wherein each sub-body 5.$i$ is connected with two columns 6.$i$.A and 6.$i$.B of taps. The taps of the resistor network 2, which are part of the respective columns 6.$i$.A and 6.$i$.B ($i=1, \ldots, 4$), are numbered respectively 8.$i.j$.A and 8.$i.j$.B ($i=1, \ldots, 8; j=1, \ldots, J$). The resistor sub-bodies 5.$i$ are not yet mutually connected in this intermediate stage, but metal contact plates for connections with metal wires are already connected with the taps 8.$i.j$.A and 8.$i.j$.B ($i=1, \ldots, 8; j=1, \ldots, J$). During manufacturing inevitable placement errors of the respective taps 8.$i.j$ with respect tot the respective resistor sub-bodies 5.$i$ occur. These placement errors are correlated between subsequent column positions of the same resistor sub-body and between column positions of the resistor sub-bodies. This correlation can for example occur in situations wherein the resistor network is of a semiconductor type which is fabricated by using a mask with mask-feature placement errors. An example of placement errors of taps will hereafter be discussed with reference to the example of FIG. 3.

Figure 4A:
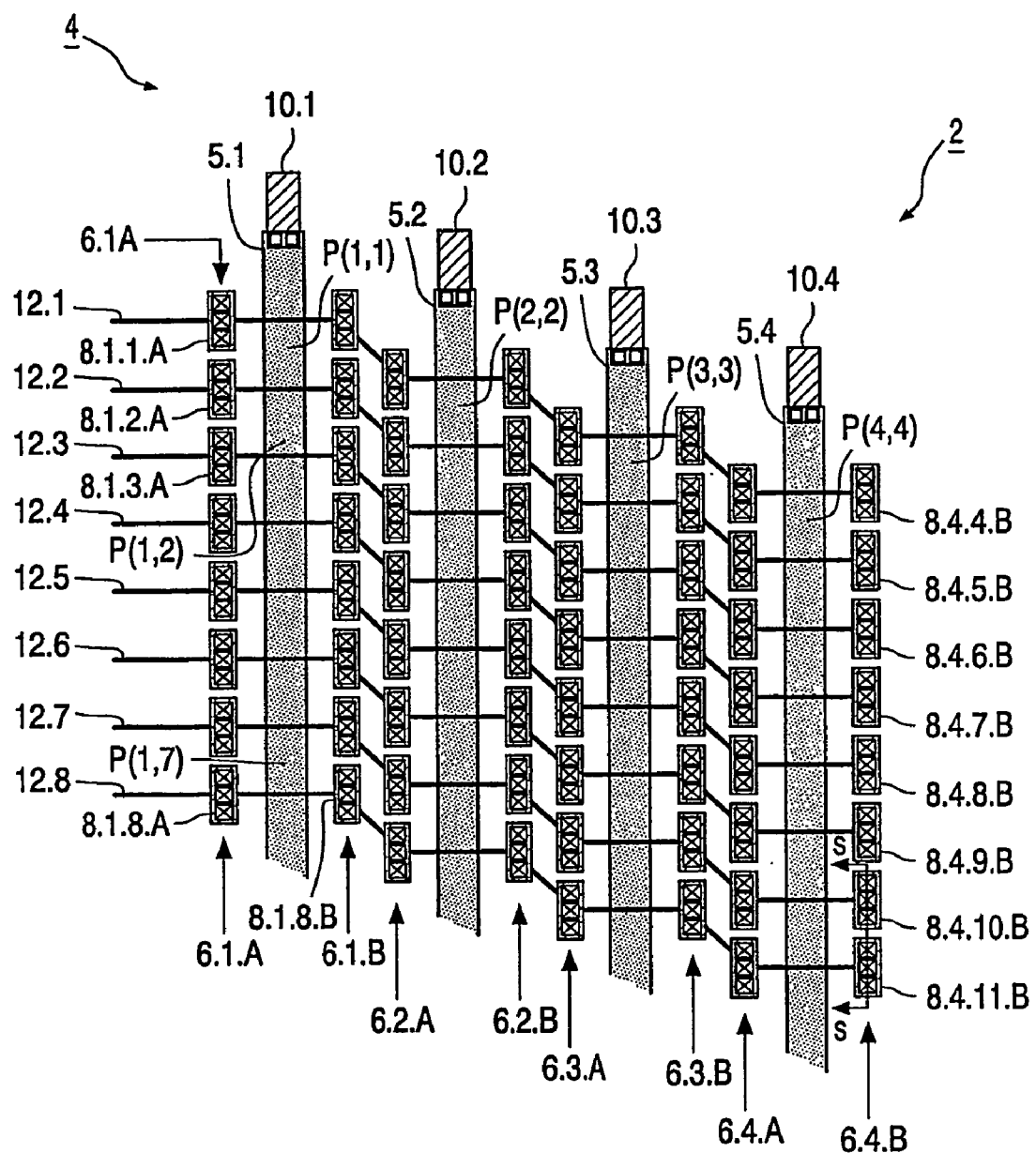
FIG. 4a is a schematic overview of the second embodiment in a first final variant.

Hereafter, the resistor part (electrical resistance) of the resistor sub-body 5.$i$ between the pair of taps 8.$i.j$.A, 8.$i.j$.B and the pair of taps 8.$i.(j+1)$.A, 8.$i.(j+1)$B is called the resistance P(i, j). The resistances are thus denoted in matrix-form. If a first pair of taps 8.1.*j*.A and 8.1.*j*.B for a fixed j (j=1, ..., (j−1)) of resistor sub-body 5.1 is placed too close to a second pair of taps 8.1.(*j*+1).A and 8.1.(*j*+1).B, then the electrical resistance P(1, j) of the part of the resistor sub-body 5.1 between these first and second pair of taps will be correspondingly too small. The placement errors of the taps are correlated. This implicates that if P(1, j) is too small that the resistances P(i, j) (i=2, 3, 4; fixed j) will also be smaller than intended. Furthermore, the resistance P(i,j+1) will generally be larger than intended. This knowledge can be used for averaging out the effects of the placement errors of the taps. A possible way of averaging out is shown in FIG. 4*a*, wherein the respective taps of the first column 6.1.B are shifted at least one column position with respect to the column positions of the taps of the column 6.2.A., etc. Consequently, the resistor network in FIG. 4*a* has successive parts of the resistor sub-bodies 4.*i* (i=1, ..., 4) which are connected in parallel. For example, the parts P(1,1), P(2,2), P(3,3) and P(4,4) are connected in parallel. By connecting shifted parts of different resistor sub-bodies in parallel the effects of the said correlated placement errors are largely reduced. Furthermore it is shown that the parts P(2,1), P(3,1), P(3,2), P(3,3), P(4,1), P(4,2) and P(4,3) are removed from the network. The respective supply connections 10.*i* (i=2, ..., 4) are correspondingly connected to different positions of the respective resistor sub-bodies.

Figure 4B:
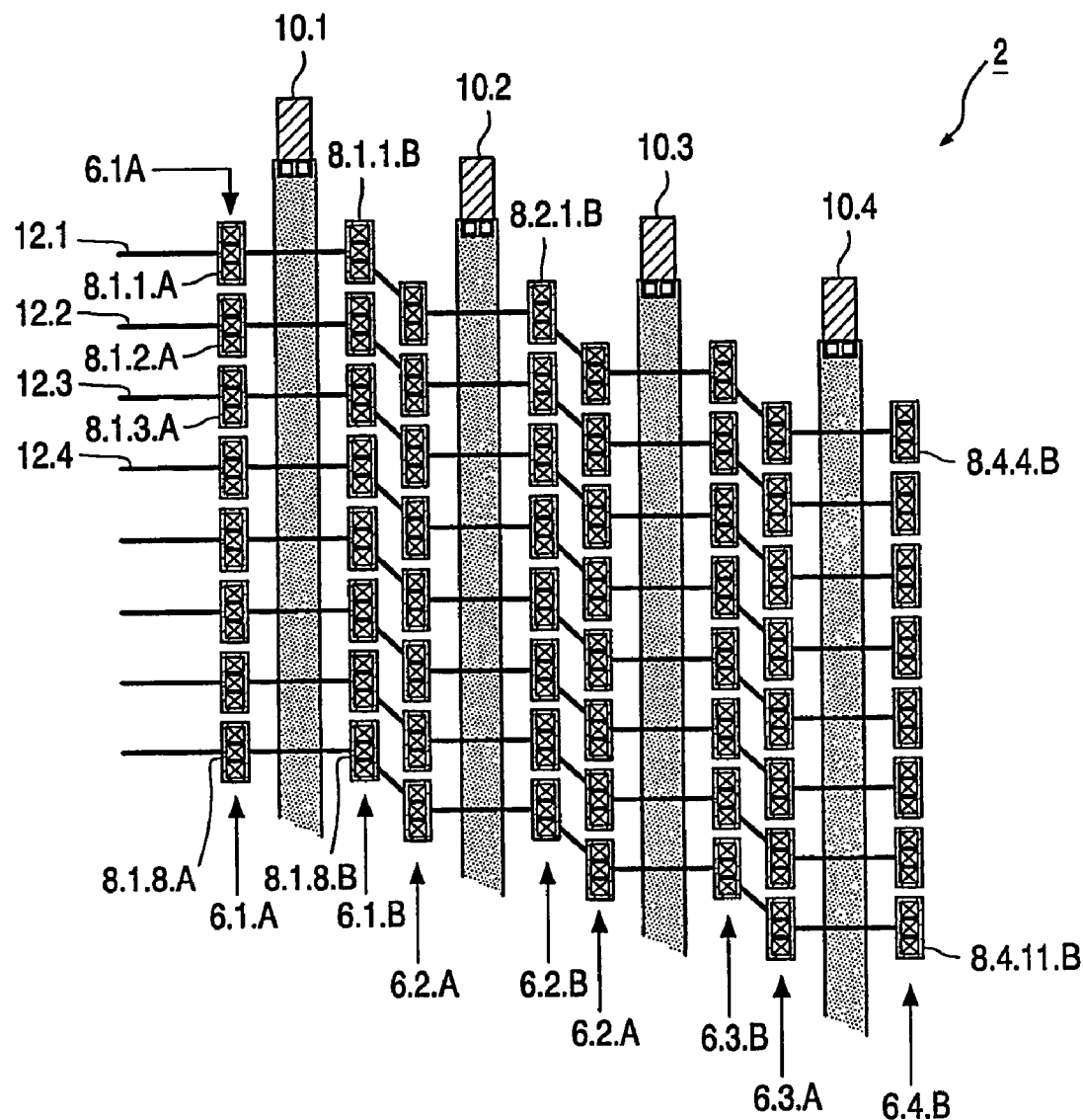
FIG. 4b is a schematic overview of the second embodiment in a second final variant.

In FIG. 4*b* a resistor network 2 is shown wherein the respective connections with the respective taps are made at arbitrary positions during fabrication of the resistor network. For example, with tap 8.1.1.B a connection is made at a certain distance from one of the extremities of the tap, while with tap 8.2.1.B. a connection is made at the extremity. As a consequence of these arbitrary placements of connections with the taps different resistor values of parts of parallel resistor sub-bodies are averaged to a large extent, yielding a resistor network with a relatively high accuracy.

Figure 5:
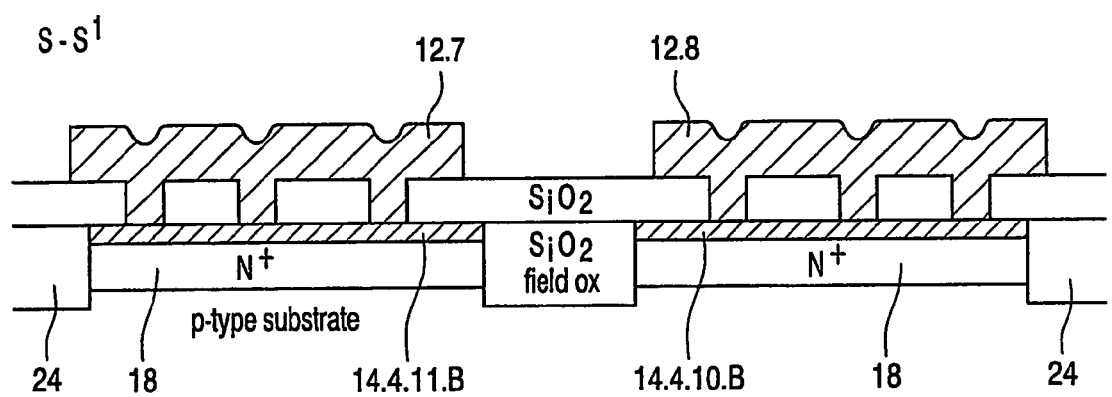
FIG. 5 is a schematic depiction of a part of the second embodiment of FIGS. 3 and 4.

FIG. 5 gives an illustration of how the resistor network 2 can be built up as a semiconductor network. FIG. 5 is a cross-section of the taps 8.4.10.B and 8.4.11.B according to the line S'-S in the FIGS. 3 and 4. In FIG. 5 the respective metal wires 12.7 and 12.8 are connected with respective titanium contact plates 14.4.10.B and 14.4.11.B. The titanium contact plates are in conduction with the resistor sub-body 5.4, via a layer 18 of suited resistance material, for example n-doped silicon. Furthermore, the network 2 comprises a insulator layer 24, for example of silicon-oxide.

The invention has been described according to a few embodiments. However, it should be noted that the invention can be practised otherwise than as specifically illustrated and described without departing from its spirit or scope. According to a possible modification the resistor network is provided with additional layers, which layers establish electrical connections between taps connected to different resistor sub-bodies. In this way, the current flowing through the resistor network is further homogenized and unwanted potential differences are prevented. This improves the performance of the resistor network.

The invention claimed is:

1. A resistor network comprising:
    a resistor body that includes multiple elongate resistor sub-bodies, and
    a plurality of columns of taps,
    each of the resistor sub-bodies situated between and along two of the columns of taps and connected to each of the taps of the two columns of taps, with electrical connection between respective sub-bodies being exclusively via the taps connected to the respective resistor sub-bodies,
    wherein at least two of the taps are configured to be connected with respective first and second sources of reference input potentials, and
    at least two taps in one of the plurality of column of taps are configured to provide respectfully different output potentials due to respective locations at which said at least two taps connect to the one or more of the resistor sub-bodies.

2. A resistor network according to claim 1, wherein each tap of the columns of taps is a T-shaped or S-shaped projection which is connected with one of the resistor sub-bodies.

3. A resistor network according to claim 1, characterized in that, a plurality of taps of a first column of taps of a first resistor sub-body is connected with a plurality of taps of a second column of taps of a second resistor sub-body, wherein each tap of the plurality of taps of the first column is connected with only one tap of the plurality of taps of the second column and wherein each tap of the plurality of taps of the second column is connected with only one tap of the plurality of taps of the first column.

4. A resistor network according to claim 3, characterized in that, each tap of the first column is shifted at least one column position with respect to the column position of the tap of the second column with which the tap of the first column is connected.

5. A resistor network according to claim 3, characterized in that, the respective connections between the resistor sub-bodies with the taps are made during fabrication of the resistor network at different arbitrary positions with respect to the respective taps.

6. A resistor network according to claim 1, characterized in that, the resistor network is a semiconductor circuit, wherein each resistor sub-body comprises a number of resistor layers, wherein each semi-conducting resistor layer comprises at least two taps, and wherein the semi-conducting resistor layers are interconnected via the taps.

7. A resistor network according to claim 1, wherein each of the taps is connected to at most two resistor sub-bodies, and wherein each resistor sub-body is connected to a plurality of taps.

8. An Analog-Digital converter for generating a digital output signal on the basis of an analog input signal, characterized in that, the Analog-Digital converter comprises a resistor network having
    a resistor body that includes multiple elongated resistor sub-bodies, and
    a plurality of columns of taps, each of the resistor sub-bodies situated between and along two of the columns of taps and connected to each of the taps of the two columns of taps, with electrical connection between respective sub-bodies being exclusively via the taps connected to the resistor sub-bodies
    wherein at least two of the taps are configured to be connected with respective first and second sources of reference input potentials,
    and each tap of the column of taps is configured for outputting an output potential.

9. A Digital-Analog converter for generating an analog output signal on the basis of a digital input signal, characterized in that, the Digital-Analog converter comprises a resistor network having
    a resistor body that includes multiple elongated resistor sub-bodies, and a plurality of columns of taps, each of the resistor sub-bodies situated between and along two of the columns of taps and connected to each of the taps of the two columns of taps, with electrical connection between respective sub-bodies being exclusively via the taps connected to the resistor sub-bodies wherein at least two of the taps are configured to be connected with respective first and second sources of reference input potentials, and each tap of the column of taps is configured for outputting an output potential.

10. A resistor ladder network, comprising:

a resistor body that includes multiple elongated resistor sub-bodies; and a plurality of columns of taps, each of the resistor sub-bodies situated between and along two of the columns of taps and connected to each of the taps of the two columns of taps, the columns of taps arranged in parallel to and alternating with the resister sub-bodies, wherein at least two of the taps are configured to be connected with respective first and second sources of reference input potentials, each tap of the columns of taps is configured for outputting an output potential via a contact area which is connected with the concerning tap, and the only electrical connections between the resistor sub-bodies are electrical connections via the taps connected to the resistor sub-bodies.

11. A resistor ladder network according to claim 10, wherein each tap of the columns of taps is a T-shaped or S-shaped projection which is connected with one of the resistor sub-bodies and each of the columns of taps includes at least three taps.

12. A resistor ladder network according to claim 10, wherein a plurality of taps of a first one of the columns of taps connected to a first one of the resistor sub-bodies is connected with a plurality of taps of a second one of the columns of taps connected a second one of the resistor sub-bodies, each tap of the first column connected with only one of the taps of the second column.

13. A resistor ladder network according to claim 12, wherein each tap of the first column is shifted at least one column position with respect to a column position of the tap of the second column with which the tap of the first column is connected.

* * * * *